United States Patent [19]

Kang

[11] Patent Number: 5,003,396
[45] Date of Patent: Mar. 26, 1991

[54] BLACK AND WHITE MONITORING SYSTEM FOR USE IN A REMOTE CONTROLLER

[75] Inventor: Cheol H. Kang, Kyungsangbook-Do, Rep. of Korea

[73] Assignee: Goldstar Co., Ltd., Seoul, Rep. of Korea

[21] Appl. No.: 386,709

[22] Filed: Jul. 31, 1989

[30] Foreign Application Priority Data

Jul. 30, 1988 [KR] Rep. of Korea ............... 12567/1988

[51] Int. Cl.$^5$ .......................................... H04N 5/445
[52] U.S. Cl. ................... 358/194.1; 455/151; 455/603
[58] Field of Search ................ 358/194.1, 192.1; 455/151, 352, 353, 603, 618

[56] References Cited

U.S. PATENT DOCUMENTS

| | | | |
|---|---|---|---|
| 4,375,651 | 3/1983 | Templin et al. | 358/194.1 |
| 4,654,891 | 3/1987 | Smith | 358/618 |
| 4,764,981 | 8/1988 | Miyahara | 455/603 |
| 4,825,200 | 4/1989 | Evans et al. | 358/194.1 |

FOREIGN PATENT DOCUMENTS

0140371 11/1980 Japan ................................. 358/194.1
0254875 10/1988 Japan .

*Primary Examiner*—James J. Groody
*Assistant Examiner*—James Juo

[57] ABSTRACT

A black and white monitoring system apparatus for use in a remote controller having a light receiver, an analog multiplexer, a signal level controller, an analog switching member, A/D converters, latches, parallel/serial converters, a control signal generator, a first oscillator, an OR gate, and a light transmitter disposed in the television set. The remote controller has a remote control signal generator, a control signal light transmitter, a remote control signal separator, a vertical driving circuit, a horizontal driving circuit, a liquid crystal monitor, a control signal generator, and second oscillator. In this system, a broadcast television picture is reproduced on a liquid crystal monitor in black and white so that the television picture can be seen on the remote controller by freely selecting a channel.

1 Claim, 9 Drawing Sheets

BLACK AND WHITE MONITORING SYSTEM FOR USE IN A REMOTE CONTROLLER

BACKGROUND OF THE INVENTION

1. Field of the Invention

The present invention relates to a black and white monitoring system for use in a remote controller and more particularly, to a black and white monitoring system which includes a horizontal driving circuit, vertical driving circuit, and a liquid crystal monitor so that the picture of the television is reproduced on the liquid crystal monitor upon a selection of the remote controller.

2. Description of the Prior Art

Generally, various conventional remote controllers are used only to remotely control several functions of the television and the like.

Recently, since television broadcasting programming has become diversified, a television viewer may also intend to watch by selecting the television broadcasting program which fits one's own taste. Accordingly, one television broadcasting program is displayed on a main screen of a television and another television broadcasting program is displayed on a second screen of the television so that two kinds of the television broadcasting programs can be seen in one television set.

SUMMARY OF THE INVENTION

Accordingly, it is an object of the present invention to provide a black and white monitoring system for use in a remote controller.

Another object of the present invention is to provide a black and white monitoring system disposed in a television set and a remote controller wherein a luminance signal according to the television broadcasting program is selected and the picture of the luminance signal is possible to be reproduced on the liquid crystal monitor of a remote controller.

A further object of the present invention is to provide a black and white monitoring system which includes a vertical driving circuit, a horizontal driving circuit, and a liquid crystal monitor built in the remote controller and an analog multiplexer disposed in a television set for selecting a luminance signal of television broadcasting program by controlling the remote controller wherein a signal level of the luminance signal selected by the analog multiplexer is controlled, and thereafter, the luminance signal is sampled during a predetermined period according to a synchronizing signal of the television set and is converted into a parallel digital signal of predetermined bits. The parallel digital signal is converted into a serial digital signal and then transmitted through a light transmitter. The transmitted signal is received through a light receiver and is separated the serial digital signal therefrom during a predetermined period and then converted to the parallel digital signal. The parallel digital signal is applied to the vertical driving circuit through the analog multiplexer to be displayed on the liquid crystal monitor.

Other objects and further scope of applicability of the present invention will become apparent from the detailed description given below. It should be understood, however, that the detailed description and specific examples, while indicating preferred embodiments of the invention, are given by way of illustration only, since various changes and modifications within the spirit and scope of the invention will become apparent to those skilled in the art from this detailed description.

Briefly described, the present invention relates to a black and white monitoring system for use in a remote controller which comprises a black and white monitoring system apparatus with a remote controller comprises a light receiver, an analog multiplexer, a signal level controller, an analog switching circuit, A/D converters, latches, parallel/serial converters, a control signal generator, a first oscillator, an OR gate disposed in a television set, and a light transmitter, a remote control signal generator, a control signal light transmitter, a remote control signal separator, a vertical driving circuit, a horizontal driving circuit and a liquid crystal monitor, a control signal generator, and a second oscillator built in the remote controller. The television broadcasting picture is reproduced on the liquid crystal monitor in black and white so that the television picture is seen on the remote controller by freely selecting a channel.

BRIEF DESCRIPTION OF THE DRAWINGS

The present invention will become more fully understood from the detailed description given below and the accompanying drawings which are given by way of illustration only, and thus are not limitative of the present invention, and wherein.

DETAILED DESCRIPTION OF THE INVENTION

Figure 1:
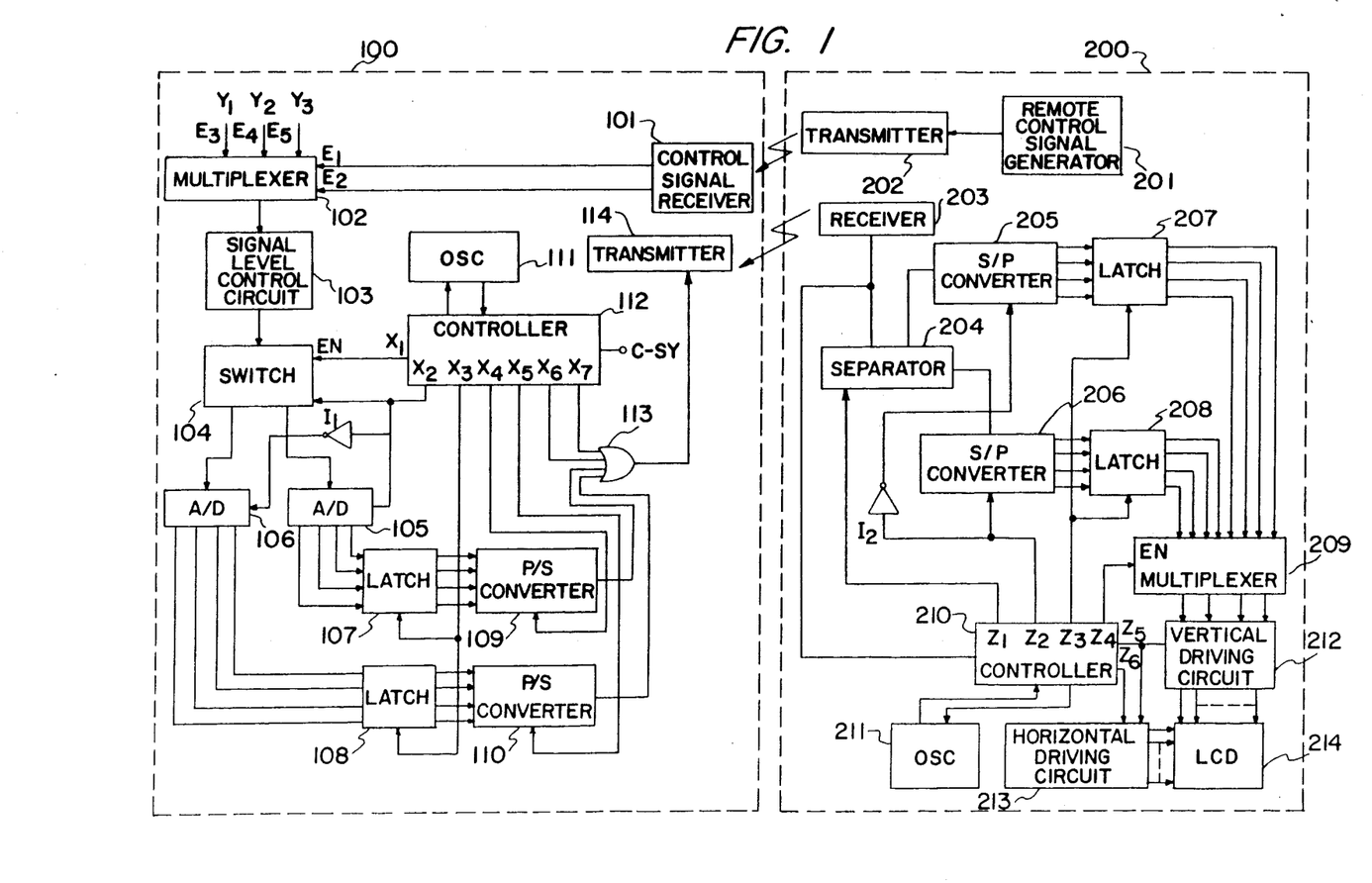
FIG. 1 is a block diagram illustrating a black and white monitoring system with a remote controller according to the present invention.

FIG. 1 is a block diagram of a black and white monitoring system for use with a remote controller of the present invention as shown in FIGS. 1, 2, 3, and 4. A receiving circuit 100 of the black and white monitoring system includes a control signal light receiver 101 for receiving a remote control signal; an analog multiplexer 102 for outputting one of luminance signals Y1–Y3 according to a selection signal from the control signal light receiver 101; a signal level control circuit 103 for controlling an output signal level of the analog multiplexer 102, an analog switching means 104 for sampling an output signal of the signal level control circuit 103 in a predetermined period and for outputting to two output terminals alternatively: A/D converters 105 and 106 for converting an output signal of the analog switching circuit 104 to a digital signal of four bits; latches 107 and 108 for latching the output signal of the A/D converters 105 and 106; parallel/serial converters 109 and 110 for converting the four bits, a parallel output signal from the latches 107 and 108 to a serial signal; and a control signal generator 112 for receiving a combined synchronizing signal C-SY as an input signal and generating various kinds of a control signal, a starting pulse SP, a vertical synchronizing signal, and an oscillation control signal for controlling the driving of the analog switching means 104, A/D converters 105 and 106, latches 107 and 108, and parallel/serial converters 109 and 110. The receiving circuit 100 further includes an oscillator 111 for generating the oscillation signal according to the oscillation control signal of the control signal generator 112 and for applying to the control signal generator 112; an OR gate 113 for summing logically an output signal from the parallel/serial converters 109 and 110, and the starting pulse SP, horizontal and vertical synchronizing signals of the control signal generator 112; and a light transmitter 114 for transmitting the output signal of the OR gate 113 with the infrared ray light. A transmitting circuit 200 of the black and white monitoring system includes a remote control signal generating circuit 201 for generating the remote control signal; a control signal light transmitter 202 for transmitting the remote control signal of the remote control signal generating circuit 201 with the infrared ray light; a light receiver 203 for receiving a infrared ray signal transmitted from the light transmitter 114; a remote control signal separator 204 for separating alternatively the four bits serial digital signal from an output signal of the light receiver 203; serial/parallel converters 205 and 206 for converting the output signal of the remote control signal to four bits parallel signal; latches 207 and 208 for latching the output signal of the serial/parallel converters 205 and 206; a multiplexer 209 for outputting by selecting the output signal of the latches 207 and 208; a vertical driving circuit 212 for outputting an vertical driving signal according to the output signal of the multiplexer 209; a liquid crystal monitor 214 for displaying the picture according to the output signal of the output of the vertical driving circuit 212 and the output signal of the horizontal driving circuit 213; a control signal generator 210 for generating various control signal an oscillation control signal for separating a synchronizing signal from the output signal of the light receiver 203 and for controlling the serial/parallel converters 205 and 206, latches 207 and 208, a multiplexer 209, a vertical driving circuit 212, and a horizontal driving circuit 212, and the like; and an oscillator 211 for generating an oscillation signal according to an oscillation control signal of the control signal generator 210 and for applying to the control signal generator 210. Symbols I1 and I2 in the drawings are inverters.

According to the present invention, the monitoring system operates as follows:

As shown in FIGS. 2 and 3, when the control signal is generated by the control signal generating circuit 201 of the transmitting circuit 200, the control signal is transmitted through the control signal light transmitter 202 as the infrared ray light. The infra red ray light is received by the control signal light receiver 101 of the receiving circuit 100 and applied to selection terminals E1 and E2 of the analog multiplexer 102. One of three luminance signals Y1–Y3 is selected and outputted to the analog multiplexer 102 as shown in FIG. 2A. Thus, the luminance signal outputted from the analog multiplexer 102 of which level is controlled by the signal level control means 103 and is then applied to the analog switching means 104. The control signals outputted from terminals X1 and X2 of the control signal generator 112 as shown in FIGS. 2B and 2C, are applied to the analog switching member 104.

Accordingly, the luminance signal outputted from the signal level control member 103 is sampled according to the control signal outputted from the output terminal X1 of the control signal generator 112 and then being applied alternatively to the A/D converters 105 and 106 according to the level of the control signal output from the outputted terminal X2. When the level of the control signal outputted from the output terminal X2 has a high potential, the sampled signal is applied from the analog switching member 104 to the A/D converter 105. When the level of the control signal outputted from the output terminal X2 has a low potential, the sampled signal from the analog switching means 104 is applied to the A/D converter 106.

Figure 2A:
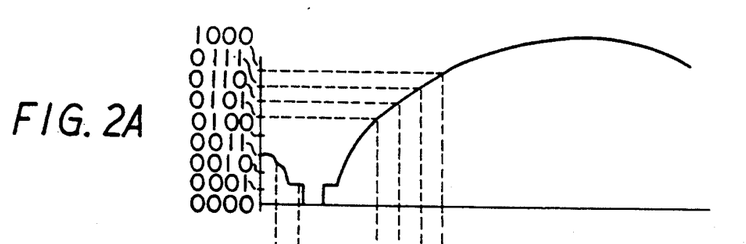
FIGS. 2 and 3 are waveform charts illustrating an output of each portion of FIG. 1.
Figures 2B, 2C:
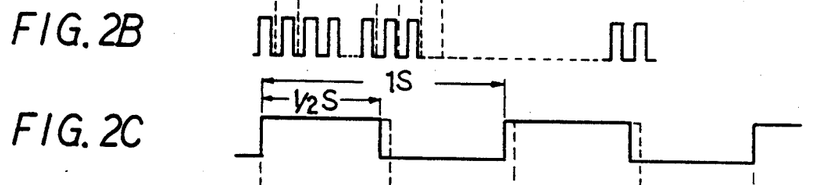
Figure 2D:
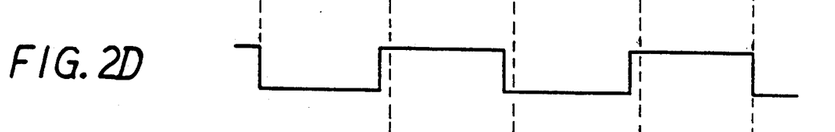
Figure 2E:
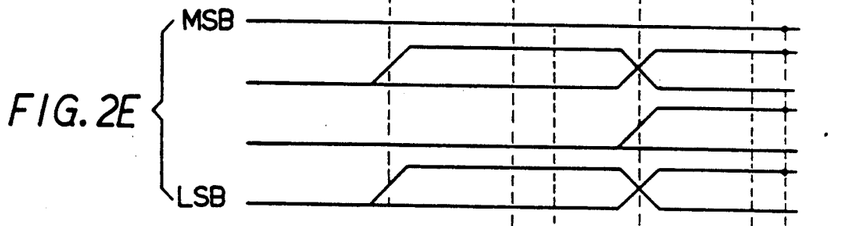
Figures 2F, 2G:
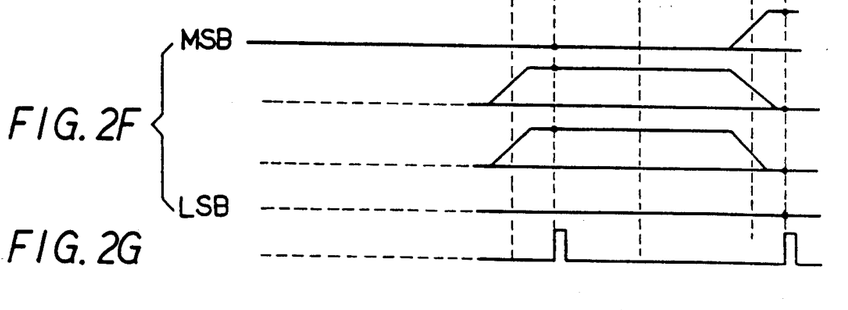

Furthermore, since the control signal outputted from the output terminal X2 of the control generator 112 is applied to the A/D converter 105, and at the same time, the signal is inverted by the invertor as shown in FIG. 2D and applied to the A/D converter 106, four bits of parallel digital signal divided by the most significant bit MSB and least significant bit LSB is outputted from the A/D converters 105 and 106 as shown in FIGS. 2E and 2F and applied to the latches 107 and 108. Since the control signal outputted from the output terminal X3 of the control signal generator 112 as shown in FIG. 2G and the clock signal is applied to the latches 107 and 108, the output signals of the A/D converters 105 and 106 are latched to the latches 107 and 108 and outputted.

Figure 2H:
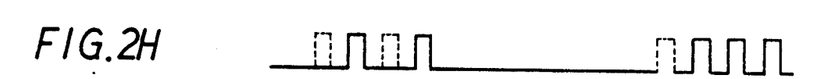
Figure 2I:
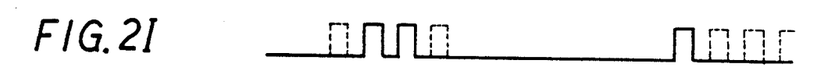

Furthermore, the control signal including the dotted line as shown in FIGS. 2H and 2I is outputted from output terminals X4 and X5 of the control signal generator 112 and is applied to the parallel/serial converters 109 and 110. Thus, the four bits of parallel digital signal outputted from the latches 107 and 108 are converted to the serial digital signal by the parallel/serial converters 109 and 110 as shown by the solid line in FIGS. 2H and 2I and outputted.

Figure 2J:
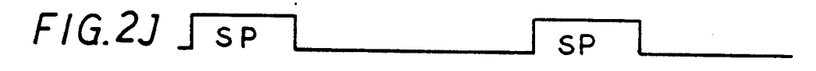
Figure 2K:
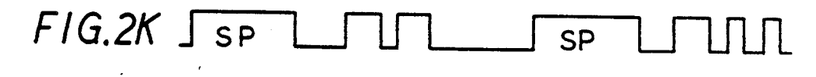

The starting pulse SP is outputted to the output terminal X6 of the control signal generator 112 as shown in FIG. 2J. The starting pulse SP is combined with the output signal of the parallel/serial converters 109 and 110 at the OR gate 113 as shown in FIG. 2K, by the same time, being combined with the horizontal and vertical synchronizing signals which is outputted from an output terminal X7 of the control signal generator 112 and then transmitted with the infrared ray light through the light transmitter 114.

Figure 3A:
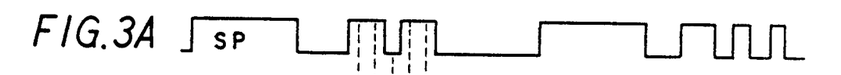
Figure 3B:
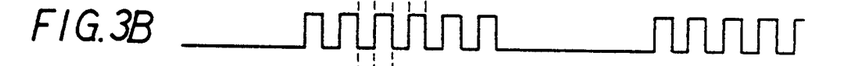
Figure 3C:
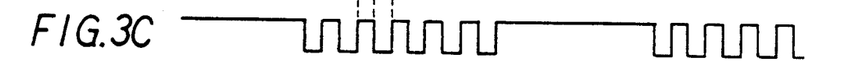
Figure 3D:
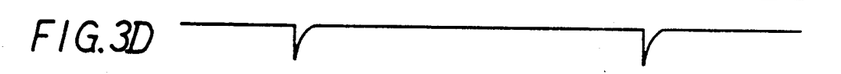
Figure 3E:
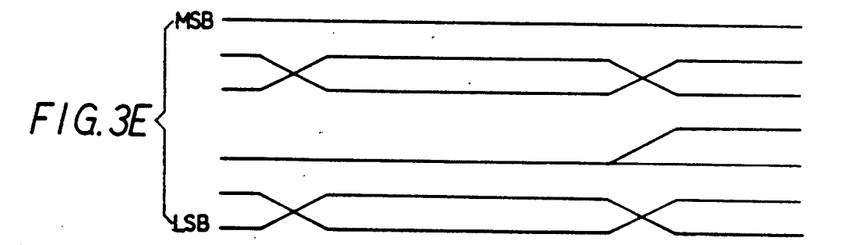
Figure 3F:
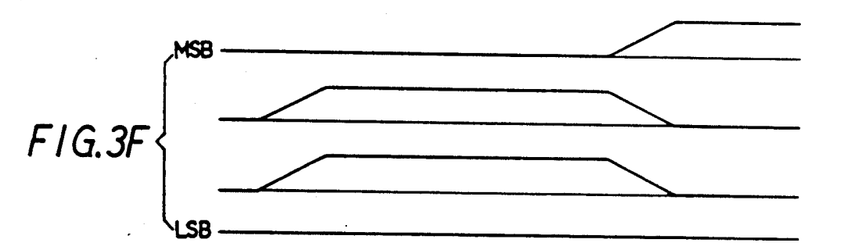

Since the signal being outputted is received to the light receiver 203 of the transmitting member 200, the signal having the waveform as shown in FIG. 3A is outputted from the light receiver 203 and is applied to the control signal generator 210 and the remote control signal separator 204. Accordingly, the serial digital signal excluding the starting pulse SP, of the output of the light receiver 203 is separated according to the received control signal from the output terminal Z1 of the control signal generator 210 and the remainder of the signal is applied alternatively to the serial/parallel converters 205 and 206. Furthermore, the control signal as shown in FIG. 3B is outputted from an output terminal Z2 of the control signal generator 210 and applied to the serial/parallel converter 206 as a clock signal, at the same time, the signal is inverted by an invertor I2 as shown in FIG. 3C and applied to the serial/parallel converter 205 as a clock signal. Accordingly, the serial digital signal alternatively outputted from the remote control signal separator 204 is converted to the four bits parallel digital signal at the serial/parallel converters 205 and 206 and being applied to the latches 207 and 208. At that time, since the pulse signal as shown in FIG. 3D is output to the output terminal Z3 of the control signal generator 210 and applied to the latches 207 and 208 as shown in FIGS. 3E and 3F, the digital signals are applied to the input terminals of the multiplexer 209.

Figure 3G:
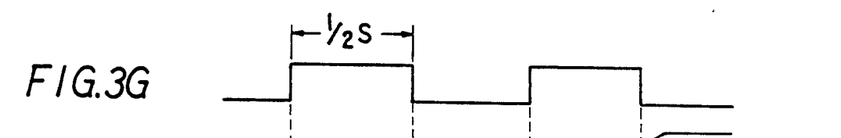
Figure 3H:
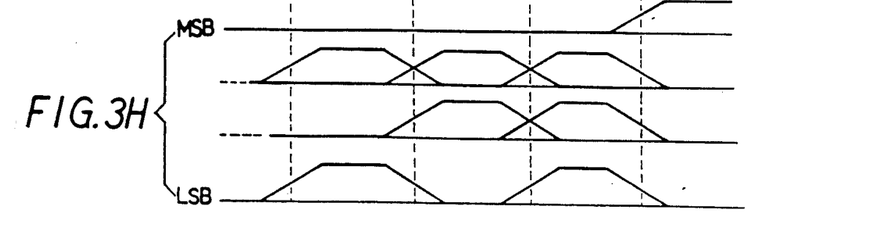

The control signal as shown in FIG. 3G is outputted from an output terminal Z4 of the control signal generator 210 and applied to the enable terminal EN of the multiplexer 209 as a selection signal. The output signals from the latches 207 and 208 are alternatively selected by the multiplexer 209 and outputted as shown in FIG. 3H. The output signal of the multiplexer 209 is applied to the vertical driving circuit 212.

The control signal outputted from the output terminal Z5 of the control signal generator 210 is applied to the vertical driving circuit 212, and at the same time, the control signals outputted from the output terminal Z5 and an output terminal Z6 is applied to the horizontal driving circuit 213 to reproduce the picture according to the output signal of the multiplexer 209 on the liquid crystal monitor 214.

Figure 4:
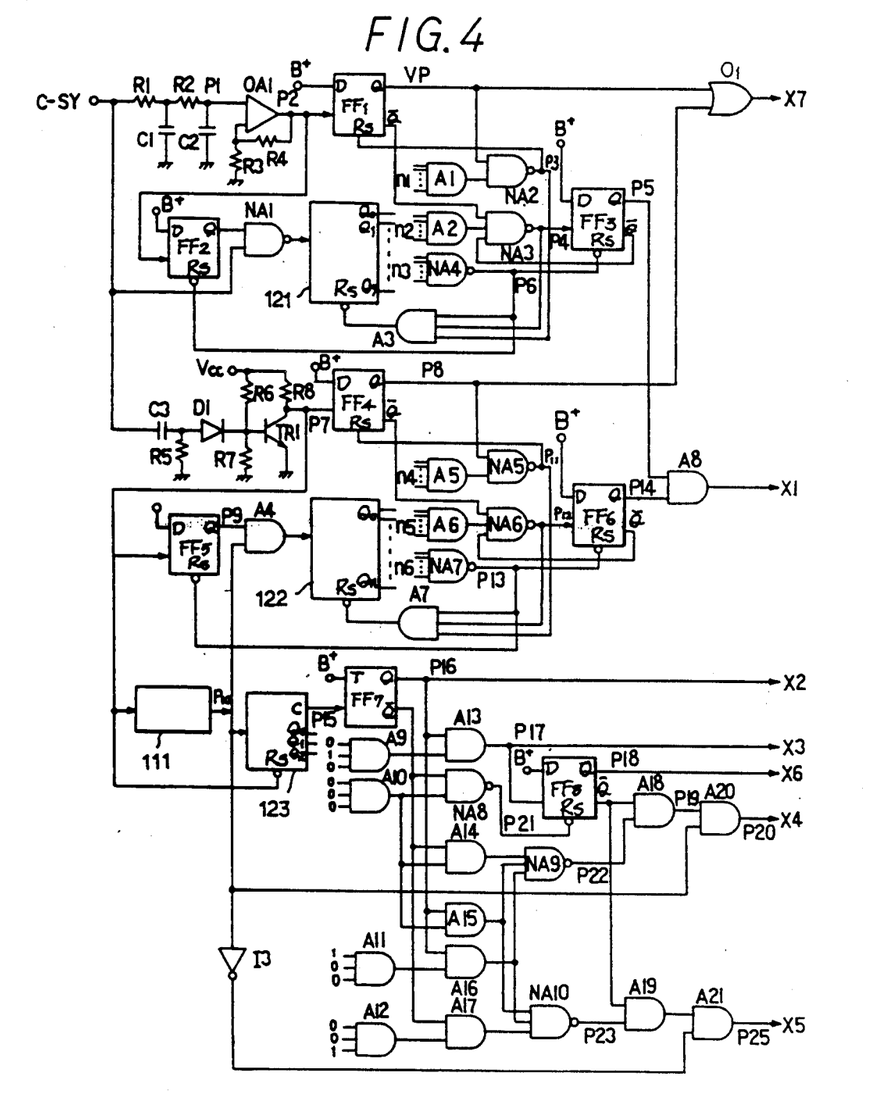
FIG. 4 is a circuit diagram illustrating a control signal generating circuit in receiving circuit of FIG. 1.

FIG. 4 illustrates the circuit diagram of the control signal generator 112 of FIG. 1 and the operational process of the control signal generator 112 will be described in detail with reference to the waveform charts of FIGS. 5A to 5Z.

Figure 5A:
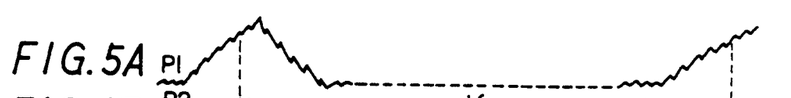
FIGS. 5A to 5Z are waveform charts illustrating an output of each portion of FIG. 4.
Figures 5B, 5C, 5D:
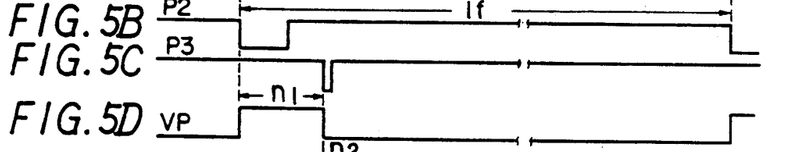

When the combined synchronizing signal C-SY of the television set is inputted, the combined synchronizing signal C-Sy is integrated as shown in FIG. 5A by resistors R1 and R2 and capacitors C1 and C2 and applied to the inversion terminal of an operational amplifier OA1. Thus, the low potential signal of a predetermined length is output to the output terminal of the operational amplifier OA1 from the portion corresponding to the vertical synchronizing signal among the combined synchronizing signals C-SY as shown in FIG. 5B. The low potential signal is applied to flip-flops FF1 and FF2 as a clock signal. The high potential signal is outputted from the output terminal Q of the flip-flop FF1 as shown in FIG. 5D, and the high potential signal is outputted from an output terminal Q of the flip-flop FF2. Since this high potential signal is applied to one side input terminal of a NAND gate NA1, the combined synchronizing signal C-SY is applied to a clock terminal of a 256-progressing counter 121 for counting. Accordingly, when the counted value outputted from output terminals Q0–Q7 of the 256-progressing counter 121 becomes "n1", the high potential signal is outputted from an AND gate A1 and applied to one side input terminal of a NAND gate NA2. Since the high potential signal output from the outputted terminal Q of the flip-flop FF1 is outputted to other side input terminal of the NAND gate NA2, the low potential signal is outputted from the NAND gate NA2 as shown in FIG. 5C. Since this low potential signal resets the flip-flop FF1, the low potential signal is outputted at output terminal Q as shown in FIG. 5D.

Figures 5E, 5F:
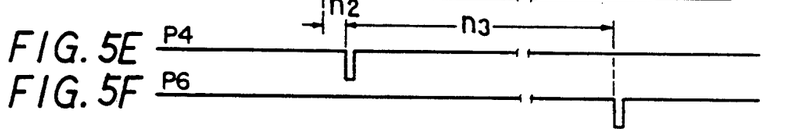
Figure 5G:
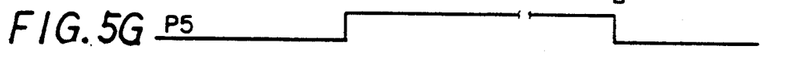

Furthermore, since the low potential signal outputted from a NAND gate NA2 is applied to an input terminal of an AND gate A3, the low potential signal is outputted to its output terminal to reset the 256-progressing counter 121. The 256-progressing counter 121 begins the counting from the start again. Thus, when the 256-progressing counter 121 counts again and its counted value becomes "n2", the high potential signal is outputted from an AND gate A2 and applied to the intermediate input terminal of a NAND gate NA3. Since the high potential signals outputted from the output terminals $\overline{Q}$ and $\overline{Q}$ of the flip-flops FF1 and FF2 are applied to the other input terminal of the NAND gate NA3, the low potential signal is outputted from the NAND gate NA3 and applied to a flip-flop FF3 as a clock signal, according to this, the high potential signal is outputted from the output terminal Q of the flip-flop FF3 as shown in FIG. 5G, and the low potential signal is outputted from the output terminal $\overline{Q}$. And, at that time, the low potential is outputted from the AND gate A3 and the 256-progressing counter 121 is reset and to count from the start again. Thus, when the 256-progressing counter 121 counts again and its counted value becomes "n3", the low potential signal is outputted from a NAND gate NA4 as shown in FIG. 5F. Since the low potential signal resets the flip-flop FF3, the low potential is outputted from the output terminal Q as shown in FIG. 5G, and the high potential signal is outputted from the output terminal $\overline{Q}$.

Furthermore, since the low potential signal outputted from the NAND gate NA4 resets the flip-flop FF2, the low potential signal is outputted from its output terminal Q and applied to one side of input terminal of the NAND gate NA1, and regardless of the combined synchronizing signal C-SY, the high potential signal is outputted continuously from the NAND gate NA1. The low potential signal is outputted from the AND gate A3 by the low potential signal outputted from the NAND gate NA4, and the low potential signal resets the 256-progressing counter 121.

Figure 5H:
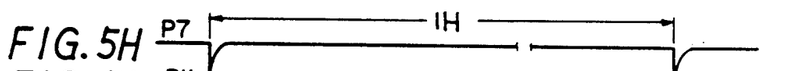

On the other hand, since the combined synchronizing signal C-SY is differentiated by a capacitor C3 and resistor R7 and turning on the transistor TR1 through the diode V1, the pulse waveform as shown in FIG. 5H is outputted from the collector and is applied to the flip-flops FF4 and FF5 as a clock signal. At the same time, this signal is applied to the oscillator 111 as an oscillation control signal and to the quinary counter 123 as a reset signal.

Figure 5I:
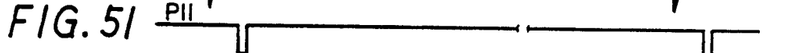
Figures 5J, 5K:
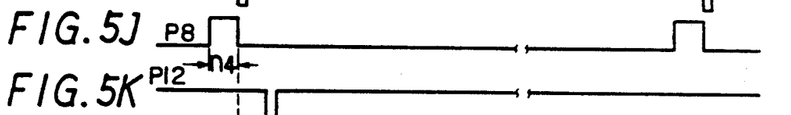
Figures 5L, 5M:
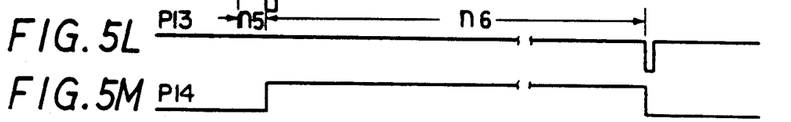
Figures 5N, 5O:
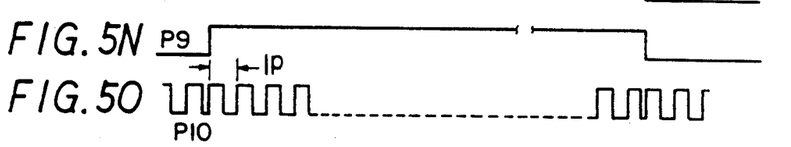

Therefore, the high potential signal is outputted from the output terminal Q of the flip-flop FF5 as shown in FIG. 5J, and the high potential signal is outputted also from the output terminal Q of the flip-flop FF5 as shown in FIG. 5N and is applied to one input terminal of the AND gate A4. Accordingly, the oscillation signal outputted from the oscillator 111 as shown in FIG. 5D is applied to the n-progressing counter 122 through the AND gate A4 as a clock signal and is counted. Therefore, when the counted value of this n-progressing counter 122 becomes "n4", the high potential signal is outputted from AND gate A5, and the low potential signal is outputted from NAND gate NA5 as shown in FIG. 5I. Since this low potential signal resets the flip-flop FF4, the low potential signal is outputted from the output terminal Q, and the high potential signal is outputted from the output terminal $\overline{Q}$. Since the low potential signal outputted from said NAND gate NA5 resets the n-progressing counter 122 through the AND gate A7, the counter begins to count again from the start. When the value of this n-progressing counter 122 becomes "n5", the high potential signal is outputted from an AND gate A6 and the low potential signal is outputted from an NAND gate NA6 as shown in FIG. 5K and applied to a flip-flop FF6 as a clock signal, the high potential signal is outputted from an output output terminal Q of the flip-flop FF6 as shown in FIG. 5M, and the low potential signal is outputted from its output terminal $\overline{Q}$. The n-progressing counter 122 is reset as aforementioned and counts again from the beginning. Thereafter, when the value of the n-progressing counter 122 becomes "n6", the low potential signal is outputted from a NAND gate NA7 as shown in FIG. 5L. Since the low potential signal is outputted from the output terminal Q as shown in FIG. 5M, the high potential signal is outputted from the output terminal $\overline{Q}$. Since the low potential signal output from the NAND gate NA7 resets the flip-flop FF5, the low potential signal is outputted from the output terminal Q. Accordingly, regardless of the output signal of the oscillator 111, the low potential signal is outputted from the AND gate A4, and at that time, the n-progressing counter 122 becomes reset as aforementioned description.

Consequently, the signal of the output terminal Q of the flip-flop FF1 as shown in FIG. 5D and the output signal of the output terminal Q of the flip-flop FF4 as shown in FIG. 5J are summed at an OR gate 01, and the horizontal and vertical synchronizing signal is outputted from an output terminal X7.

Figure 5P:
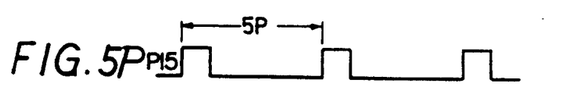
Figure 5Q:
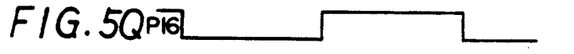

The signals of waveforms of FIGS. 5G and 5M which are the signals of the output terminals Q and $\overline{Q}$ of the flip-flops FF3 and FF6 are ANDed by the AND gate A6 and outputted from the output terminal X1. Since the oscillation signal of the oscillator 111 is applied to a quinary counter 123 as a clock signal, it begins to count. Therefore, since the high potential signal list outputted from the carry terminal C as shown in FIG. 5P after completing to count to "101" at the quinary counter 123 and applied to flip-flop FF7 as a clock signal, the output signal is inverted and the square wave signal of a predetermined period is outputted from the output terminal Q as shown in FIG. 5Q.

Figure 5R:
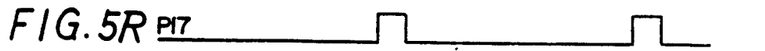
Figures 5S, 5T:
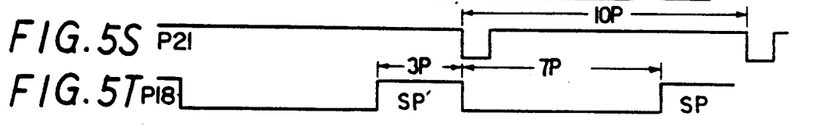
Figure 5U:
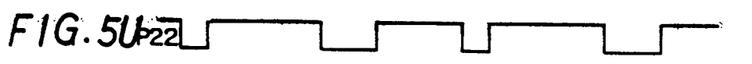

Thus, the signal output from the output terminal Q of the flip-flop FF7 is outputted from the output terminal X2. When the counted value outputted from the output terminals of the quinary counter 123 is "010", the high potential signal is outputted from an AND gate A9. When the count is "000", the high potential signal is outputted from an AND gate A10. Similarly, when the counted value is "100" and "001", a high voltage signal is outputted from AND gates A11 and A12. Therefore, when the high potential signal is outputted from an AND GATE A9 when the high potential signal is being outputted from the output terminal Q of the flip-flop FF7, the high potential signal is outputted from an AND gate A13 as shown in FIG. 5R. This high potential signal is outputted from an output terminal X3, and the high potential signal is outputted from the output terminal Q of a flip-flop FF8 and outputted from an output terminal X6 as the starting pulse Sp.

Figure 5V:
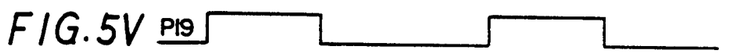
Figure 5W:
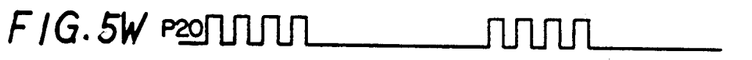

Furthermore, since the low potential signal is outputted from the output terminal $\overline{Q}$ of the flop-flop FF8, the low potential signal is outputted from an AND gate A18 as shown in FIG. 5V, and the low potential signal is outputted from an AND gate A20 as shown in FIG. 5W.

When the high potential signal is outputted from an AND gate A19 when the low potential signal is being outputted from the output terminal Q of the flip-flop FF7, that is when the high potential signal is being outputted from the output terminal $\overline{Q}$ of the flip-flop FF7, the low potential signal is outputted from a NAND gate NA8 as shown in FIG. 5S to reset the flip-flop FF8. The low potential signal is outputted from the output terminal Q, and the high potential signal is outputted from the output terminal $\overline{Q}$.

Since the output signal of an AND gate A10 is ANDed with the signal of the output terminals Q and $\overline{Q}$ of the flip-flop FF7 at an AND gates A15 and A14, and the output signal of the AND gate A11 is ANDed with the signal of the output terminal Q of the flip-flop FF7 at an AND gate A16 and then NANDed at the NAND gate NA9, the output signal of the NAND gate NA9 becomes as shown in FIG. 5U, and the signal as shown in FIG. 5V is outputted from the output terminal of an AND gate A18. Since the output signal of the oscillator becomes to pass through an AND gate A20 when the output signal is in the high potential, the signal waveform as shown in FIG. 5W is outputted from the output terminal X4.

Figure 5X:
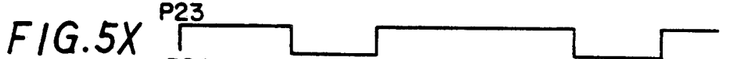
Figure 5Y:
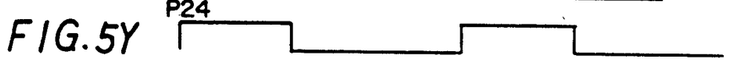
Figure 5Z:
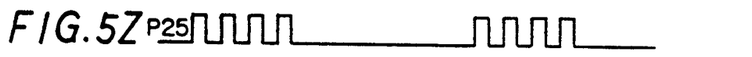

Furthermore, since the output signal of an AND gate A12 is ANDed with the signal of the output terminal $\overline{Q}$ of the flip-flop FF7 at an AND gate A17 and then the output signals of the AND gate A17 and the AND gates A15 and A16 are NANDed at the NAND gate NA10, the output signal of the NAND gate NA10 becomes as shown in FIG. 5X accordingly, the output signal of an AND gate A19 becomes as shown in FIG. 5Y. Since the oscillation signal of the oscillator 111 is passed through an inverter 13 when this output signal is in the high potential before passing through an AND gate A231, the signal waveform as shown in FIG. 5Z is outputted from an output terminal X5.

Thus, the signals outputted from the output terminals X1–X5 of the control signal generator 112 control the driving of the analog switching member 104, A/D converters 105 and 106, latches 107 and 108, parallel/serial converters 109 and 110, and the signal s outputted from the output terminals X6 and X7 are summed with the output signals, of the parallel/serial converters 109 and 110.

Figure 6:
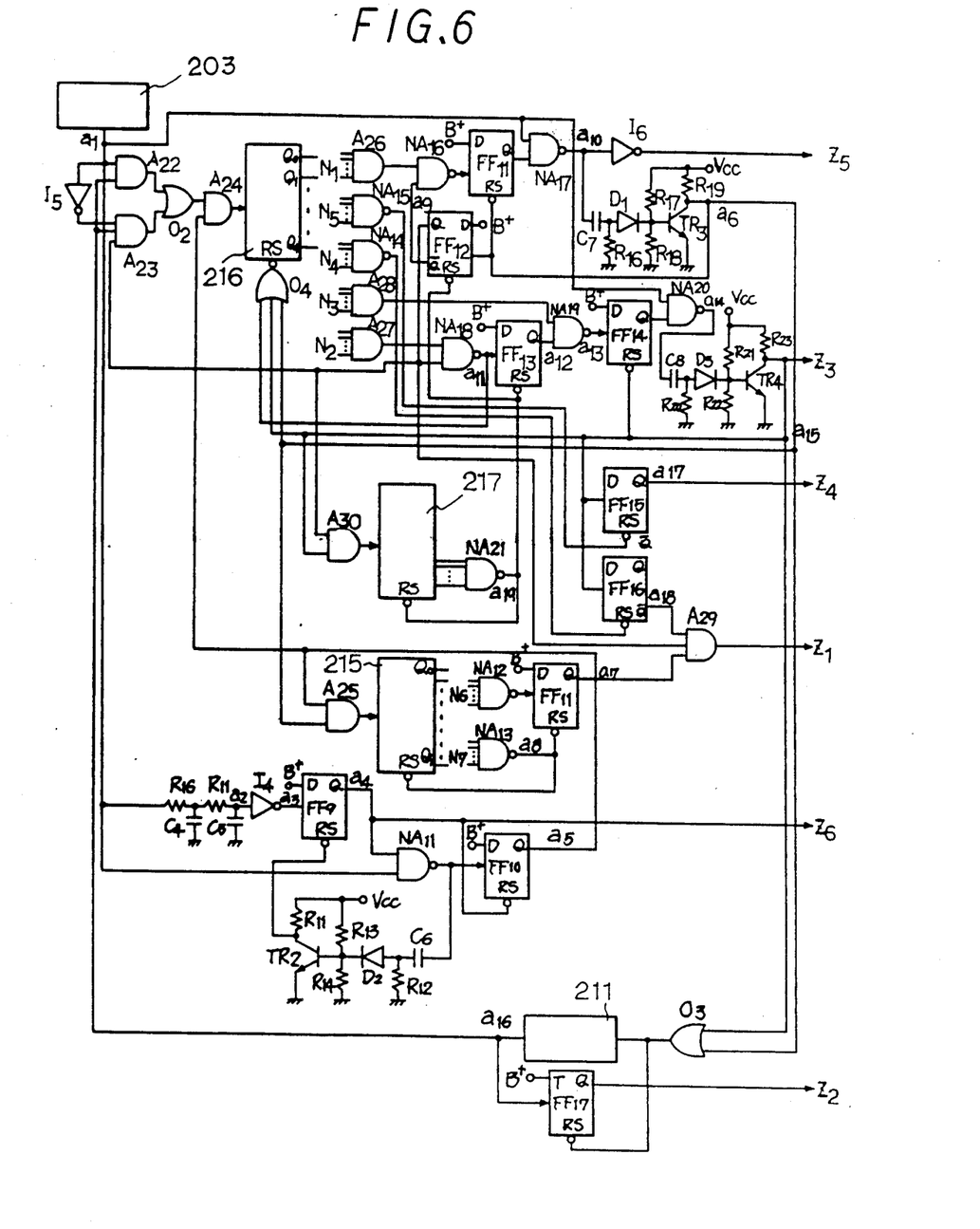
FIG. 6 is a circuit diagram illustrating a control signal generating circuit in transmitting circuit of FIG. 1.

FIG. 6 illustrates the circuit diagram of the control signal generator 210 of FIG. 1, and an operational process of this control signal generator 210 will be described in detail with reference to the waveform chart of FIGS. 7A to 7U below.

Figures 7A, 7B, 7C, 7D, 7E:
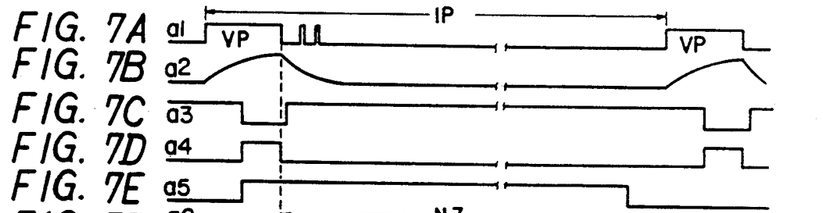
FIGS. 7A to 7U are waveform charts illustrating an output of each portion of FIG. 6.

When the combined signal as shown in FIG. 7A is outputted from the light receiver 203, the combined signal is integrated by resistors R10 and R11 and capacitors C4 and C5 as shown in FIG. 7B and a vertical synchronizing signal VP having a wider pulse width is detected. Thus, since the low potential signal is outputted from an inverter I4 as shown in FIG. 7C and is applied to a flip-flop FF9 as a clock signal, the high potential signal is outputted from the output terminal Q as shown in FIG. 7D, and this high potential signal is outputted from an output terminal Z6. On the other hand, the high potential signal outputted from the output terminal Q of the flip-flop FF9 is applied to one input terminal of a NAND gate NA11. At this moment, since the high potential vertical synchronizing signal VP is being applied to other input terminal of the NAND gate NA11, the low potential signal is outputted from the output terminal and is applied to a flip-flop FF10 as a clock signal. Thus, the high potential signal as shown in FIG. 7E is outputted from the output terminal Q of the flip-flop Ff10, and is applied to one input terminal of AND gates A24 and A25.

On the other hand, when the output of the high potential vertical synchronizing signal VP is terminated, the high potential signal is outputted from the NAND gate NA11. This high potential signal is differentiated by a capacitor C6 and a resistor R9 and the differential pulse is generated. Since the differential pulse makes a transistor TR2 to turn on through a diode D2, the low potential signal is outputted from the collector, causing the flip-flop FF9 to reset.

Figures 7F, 7G:
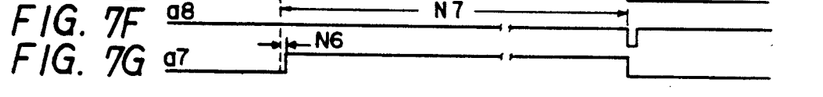
Figures 7H, 7I:
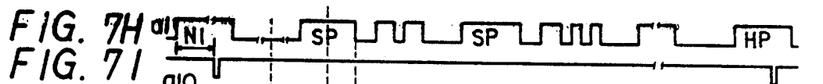
Figures 7J, 7K:
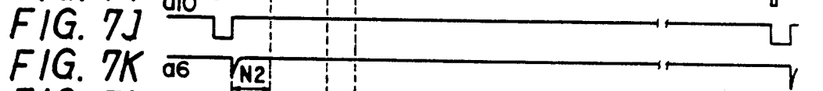

On the other hand, the pulse signal outputted from the collector of a transistor TR3 as shown in FIG. 7K is inputted to a 256-progressing counter 215 as "n6". Since the low potential signal is outputted from the NAND gate NA12 and is applied to the flip-flop FF11 as a clock signal, the high potential signal is outputted from the output terminal Q as shown in FIG. 7G.

Thereafter, when the value of the 256-progressing counter 215 becomes "n7", the low potential signal is outputted from a NAND gate NA13 as shown in FIG. 7F, and the low potential signal resets flip-flops FF10 and FF11 and the 256-progressing counter 215.

On the other hand, since the pulse signal outputted from the collector of the transistor TR3 is applied to an oscillator 211 through the OR gate O3, the oscillation signal is outputted from the oscillator 211.

A horizontal synchronizing signal HP of the combined signals outputted from the light receiver 203 as shown in FIG. 7H has a longer pulse width than the starting pulse SP. Accordingly, the oscillation signal of the oscillator 211 passes through an AND gate A22 when the horizontal synchronizing signal HP is outputted and being applied to one input terminal of an AND gate A24 through the OR gate O2. Since the high potential signal outputted from the output terminal Q of the flip-flop FF11 is being applied to other input terminal of the AND gate A24 as aforementioned, the oscillation signal applied to one input terminal is outputted from the output terminal and is applied to a 32-progressing counter 216 as a clock signal. Thus, the 32-progressing counter 216 counts the clock signal and outputs from the output terminals $Q_0$–$Q_4$. When the counted value of a 32-progressing counter 216 becomes "n1", the high potential signal is outputted from an AND gate NA26 and is applied to one side input terminal of the NAND gate NA16. Since the high potential signal outputted from the output terminal $\overline{Q}$ of the flip-flop FF12 is applied to the other input terminal of the NAND gate NA16, the low potential signal is outputted from the NAND gate NA16 as shown in FIG. 7I. This low potential signal is applied to the flip-flop FF11 as a clock signal. Thus, since the high potential signal is outputted from the output terminal Q of the flip-flop FF11, the low potential signal is outputted from a NAND gate NA17 as shown in FIG. 7J, and the low potential signal is inverted to the high potential signal at an inverter I6 to be outputted from the output terminal Z5.

Figures 7L, 7M:
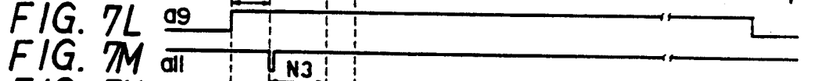
Figures 7N, 7O:
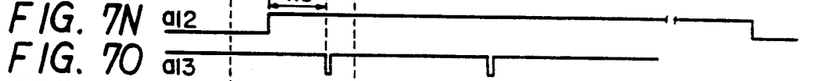

When the feeding of the horizontal synchronizing signal is terminated, the high potential signal is outputted from a NAND gate NA17. Since this high potential signal is differentiated by a capacitor C7 and a resistor R16 and rendering the transistor TR3 ON, the pulse signal as shown is FIG. 7K is outputted from the collector. Since this pulse signal is applied to the flip-flop FF12 as a clock signal, the high potential signal is outputted from the output terminal Q as shown in FIG. 7L and is applied to an input terminal of an AND gates A23 and A29 and the NAND gate NA18.

Furthermore, the pulse signal outputted from the collector of the transistor TR3 resets the 32-progressing counter 216 through an OR gate O4. The pulse signal is applied to the oscillator 211 through the OR gate O3 to control the phase. Therefore, the low potential signal outputted from the light receiver 203 is inverted to a high potential signal by an inverter I5 and is applied to one input terminal of the AND gate A23. Accordingly, the oscillation signal of the oscillator 211 inputted to the 32-progressing counter 216 becomes "n2". Since the high potential signal is outputted from the AND gate A27, the low potential signal is outputted from a NAND gate NA18 as shown in FIG. 7M and is applied to a flip-flop FF13 as a clock signal. The high potential signal is outputted from the output terminal Q to the input terminal of a NAND gate NA19.

Figures 7P, 7Q, 7R, 7S, 7U:
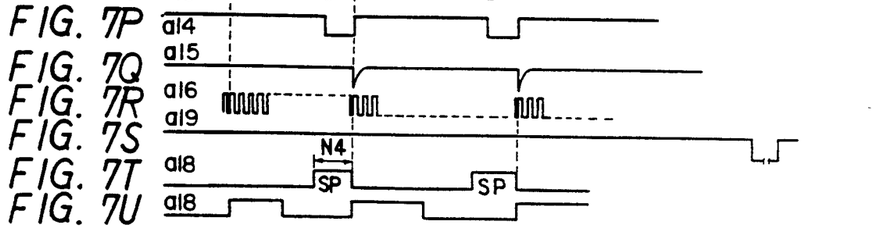

Thereafter, when the counted value of the 32-progressing counter 216 becomes "n3", and the high potential signal is outputted from a NAND gate A28, the low potential signal is outputted from the NAND gate NA19 as shown in FIG. 7Q and is applied to a flip-flop FF14 as a clock signal. The high potential signal is outputted from the output terminal Q of the flip-flop FF14 and is applied to the output terminal of a NAND gate NA20.

Therefore, when the starting pulse SP is outputted from the light receiver 203, the low potential signal is outputted from the NAND gate NA20 as shown in FIG. 7P. When the starting pulse SP is not outputted the high potential signal is outputted from the NAND gate NA20. The high potential signal is differentiated by a capacitor C8 and a resistor R20 to turn on a transistor TR4 through a diode D3. The pulse signal SP is outputted from the collector of the transistor TR4 as shown in FIG. 7Q, and the pulse signal is outputted from the output terminal Z3.

The pulse signal SP is applied to the oscillator 211 through the OR gate O3 to control the phase of the oscillation signal as shown in FIG. 7R. The pulse signal resets the 32-progressing counter 216 through the OR gate O4. Also, the pulse signal is inputted to a M-progressing counter 217 through an AND gate A30. Since the pulse signal SP is applied to a flip-flops FF15 and FF16 as a clock signal, the high potential signal is outputted from the output terminal Q of the flip-flop FF15 as shown in FIG. 7U and is outputted to the output terminal Z4. The low potential signal is outputted from the output terminal $\overline{Q}$ of a flip-flop FF16 as shown in FIG. 7T and is applied to the input terminal of an AND gate A29.

On the other hand, when the starting pulse SP is all counted during one period of the horizontal synchronizing signal HP at the M-progressing counter 217, the low potential signal is outputted from a NAND gate NA21 as shown in FIG. 7S, and the low potential signal resets the M-progressing counter 217 and the flip-flops FF12 and FF13.

When the counted value of the 32-progressing counter 216 operated as aforementioned becomes "n4", and the low potential signal is outputted from the NAND gate NA14, the flip-flop FF16 is reset. When the counted value of the 32-progressing counter 216 becomes "n5", and the low potential signal is outputted from the NAND gate NA15, the flip-flop FF15 is reset.

When the pulse signal SP is outputted from the OR gate O3, the flip-flop FF17 is reset, the output signal of the flip-flop FF17 is inverted by the inversion signal of the oscillator 211, and the signal of the output terminal Q of the flip-flop FF17 is outputted from the output terminal Z2.

Thus, the control signal outputted from the output terminals Z1–Z6 of the control signal generator 210 becomes to control the driving of the remote control signal separator 204, serial/parallel converters 205 and 206, multiplexer 209, vertical driving circuit 212, and horizontal driving circuit 213.

As described above in detail, since the monitoring system of the present invention selects one of three luminance signals by the remote controller, and the pictures according to the selected luminance signal are reproduced on the liquid crystal monitor of the remote controller, there is effect that the television picture screen is possible to see on the remote controller.

The invention being thus described, it will be obvious that the same may be varied in many ways. Such variations are not to be regarded as a departure from the spirit and scope of the invention, and all such modifications as would be obvious to one skilled in the art are intended to be included in the scope of the following claims.

What is claimed is:

1. A black and white monitoring system for use with a remote controller which comprises:

receiving means for receiving a broadcast television signal;

said receiving means including, a control signal receiver for receiving a remote control signal from a remote controller, an analog multiplexer for outputting one of a plurality of luminance signals selected by a selecting signal generated by said control signal receiver, signal level control means for controlling an output signal level of said analog multiplexer, analog switching means for sampling an output signal of said signal level control means during a predetermined period and outputting alternatively from two output terminals, A/D converters for converting an output signal of said analog switching means to a four bit parallel digital signal, first latch means for latching said four bit digital signal from said A/D converters, parallel/serial converters for converting the four bit parallel digital signal of said first latch means to a four bit serial signal, a first control signal generator for receiving a combined synchronizing signal and generating various control signals including a starting pulse, horizontal and vertical synchronizing signals, and an oscillation control signal so as to control driving of said analog switching means, A/D converters, first latch means, and parallel/serial converters, a first oscillator for generating an oscillation signal from said oscillating control signal of said control signal generator and applying said oscillation signal to said control signal generator, an OR gate for summing logically output signals from said parallel/serial converters, said starting pulse from said control signal generator, and said vertical and horizontal synchronizing signals, and a light transmitter for transmitting an output signal from said OR gate with an infrared ray light; and transmitting means for transmitting, built in said remote controller, a remote control signal;

said transmitting means including, a remote control signal generator for generating said remote control signal, a control signal light transmitter for transmitting said remote control signal from said remote control signal generator with the infrared ray light, a light receiver for receiving said output signal of said OR gate from said light transmitter, a remote control signal separator for separating alternatively said four bit serial digital signal from the output signal of said light receiver, serial/parallel converters for converting the output signal of said remote control signal separator to a four bit parallel signal, second latch means for latching the output signal of said serial/parallel converters, a multiplexer for outputting one output signal selected from a plurality of output signals from said second latch means, vertical driving means for outputting a vertical driving signal according to the output signal of said multiplexer, a liquid crystal monitor for displaying the picture according to an output signal from said vertical driving means and an output signal from a horizontal driving circuit, a second control signal generator for separating the said horizontal and vertical synchronizing signals from the output signal of said light receiver and generating various control signals and a oscillation control signal so as to control said remote control signal separator, serial/parallel converters, second latch means, multiplexer, vertical driving means and horizontal driving circuit, and a second oscillator for generating an oscillation signal from the oscillation control signal of said control signal generator and applying to said control signal generator, thereby enabling the television picture to be seen on said remote controller by freely selecting a channel.

* * * * *